US010804391B2

(12) United States Patent
Kwon et al.

(10) Patent No.: US 10,804,391 B2
(45) Date of Patent: Oct. 13, 2020

(54) VERTICAL FIELD-EFFECT TRANSISTOR (VFET) DEVICES AND METHODS OF FORMING THE SAME

(71) Applicants: Samsung Electronics Co., Ltd., Suwon-si, Gyeonggi-do (KR); International Business Machines Corporation, Armonk, NY (US)

(72) Inventors: Tae Yong Kwon, Suwon-si (KR); Kang Ill Seo, Eumseong-gun (KR); Oh Seong Kwon, Hwaseong-si (KR); Ki Sik Choi, Watervliet, NY (US)

(73) Assignees: SAMSUNG ELECTRONICS CO., LTD., Suwon-si (KR); INTERNATIONAL BUSINESS NIACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/286,023

(22) Filed: Feb. 26, 2019

(65) Prior Publication Data

US 2019/0386136 A1 Dec. 19, 2019

Related U.S. Application Data

(60) Provisional application No. 62/685,496, filed on Jun. 15, 2018.

(51) Int. Cl.

| | |
|---|---|
| ***H01L 29/78*** | (2006.01) |
| ***H01L 21/8234*** | (2006.01) |
| ***H01L 29/66*** | (2006.01) |

(52) U.S. Cl.

CPC .. *H01L 29/7827* (2013.01); *H01L 21/823412* (2013.01); *H01L 21/823418* (2013.01); *H01L 21/823431* (2013.01); *H01L 21/823462* (2013.01); *H01L 21/823487* (2013.01); *H01L 29/6653* (2013.01); *H01L 29/66666* (2013.01)

(58) Field of Classification Search

CPC .......... H01L 29/7827; H01L 29/66666; H01L 29/6653; H01L 21/823462; H01L 21/823431; H01L 21/823412

USPC .................. 257/328, 329, 324; 438/212, 268

See application file for complete search history.

(56) References Cited

U.S. PATENT DOCUMENTS

| | | | |
|---|---|---|---|
| 9,640,636 B1 | 5/2017 | Bentley et al. | |
| 9,680,473 B1 | 6/2017 | Anderson et al. | |
| 9,698,145 B1 | 7/2017 | Balakrishnan et al. | |
| 9,780,208 B1 | 10/2017 | Xie et al. | |
| 9,786,768 B1 | 10/2017 | Balakrishnan et al. | |
| 9,799,749 B1 | 10/2017 | Bi et al. | |
| 9,799,751 B1 * | 10/2017 | Zhang et al. | H01L 29/66666 |
| 9,865,730 B1 | 1/2018 | Jagannathan et al. | |
| 9,954,529 B2 | 4/2018 | Anderson et al. | |
| 2017/0330878 A1 * | 11/2017 | Pandey | H01L 27/0886 |
| 2018/0006025 A1 | 1/2018 | Hook et al. | |
| 2018/0006118 A1 | 1/2018 | Mallela et al. | |

(Continued)

*Primary Examiner* — Thinh T Nguyen

(74) *Attorney, Agent, or Firm* — Myers Bigel, P.A.

(57) ABSTRACT

Vertical field-effect transistor (VFET) devices and methods of forming VFET devices are provided. The methods may include forming a channel region that protrudes from an upper surface of a substrate in a vertical direction, forming a gate insulator layer on a side of the channel region, after forming the gate insulator layer, forming a top source/drain on the channel region, and forming a gate electrode on the gate insulator layer.

20 Claims, 13 Drawing Sheets

46
42
44
12
58 52
54
25
24
22
56
A
16
10s
10
18
D2
D1

(56) References Cited

U.S. PATENT DOCUMENTS

| | | | |
|---|---|---|---|
| 2018/0019337 | A1 | 1/2018 | Xie et al. |
| 2018/0122937 | A1 | 5/2018 | Jagannathan et al. |

* cited by examiner

VERTICAL FIELD-EFFECT TRANSISTOR (VFET) DEVICES AND METHODS OF FORMING THE SAME

CROSS-REFERENCE TO RELATED APPLICATION

This application claims priority to U.S. Provisional Application Ser. No. 62/685,496, entitled RELIABILITY LAST FOR VTFET (VERTICAL TRANSPORT FET), filed in the USPTO on Jun. 15, 2018, the disclosure of which is hereby incorporated by reference herein in its entirety.

FIELD

The present disclosure generally relates to the field of electronics and, more particularly, to vertical field-effect transistor (VFET) devices.

BACKGROUND

Various structures and manufacturing processes of VFET devices have been researched because of high scalability of VFET devices. Therefore, developing manufacturing processes that improve performance and/or reliability of VFET devices may be beneficial.

SUMMARY

According to some embodiments of the present inventive concept, methods of forming VFET devices may include forming a channel region that protrudes from an upper surface of a substrate in a vertical direction, forming a gate insulator layer on a side of the channel region, after forming the gate insulator layer, forming a top source/drain on the channel region, and forming a gate electrode on the gate insulator layer.

According to some embodiments of the present inventive concept, methods of forming VFET devices may include forming a preliminary structure that includes a channel region protruding from an upper surface of a substrate in a vertical direction, a gate insulator layer and a sacrificial layer sequentially stacked on a side of the channel region, a top spacer on the gate insulator layer and the sacrificial layer, which defines a top recess, and a top source/drain and a capping layer in the top recess. The top source/drain is between the substrate and the capping layer. The methods may also include after forming the preliminary structure, replacing the sacrificial layer with a gate electrode.

According to some embodiments of the present inventive concept, methods of forming VFET devices may include forming a channel region that protrudes from an upper surface of a substrate in a vertical direction, forming a top source/drain on the channel region, and sequentially forming a gate insulator layer and a gate electrode on a side of the channel region. The gate insulator layer may include an upper portion adjacent the top source/drain, and the upper portion of the gate insulator layer may have a straight line shape. The gate electrode may include a plurality of layers that are sequentially stacked on the gate insulator layer and may include a first layer, and the first layer of the gate electrode may include a vertical portion and a horizontal portion protruding from an upper end of the vertical portion of the first layer.

DETAILED DESCRIPTION

Figure 1:
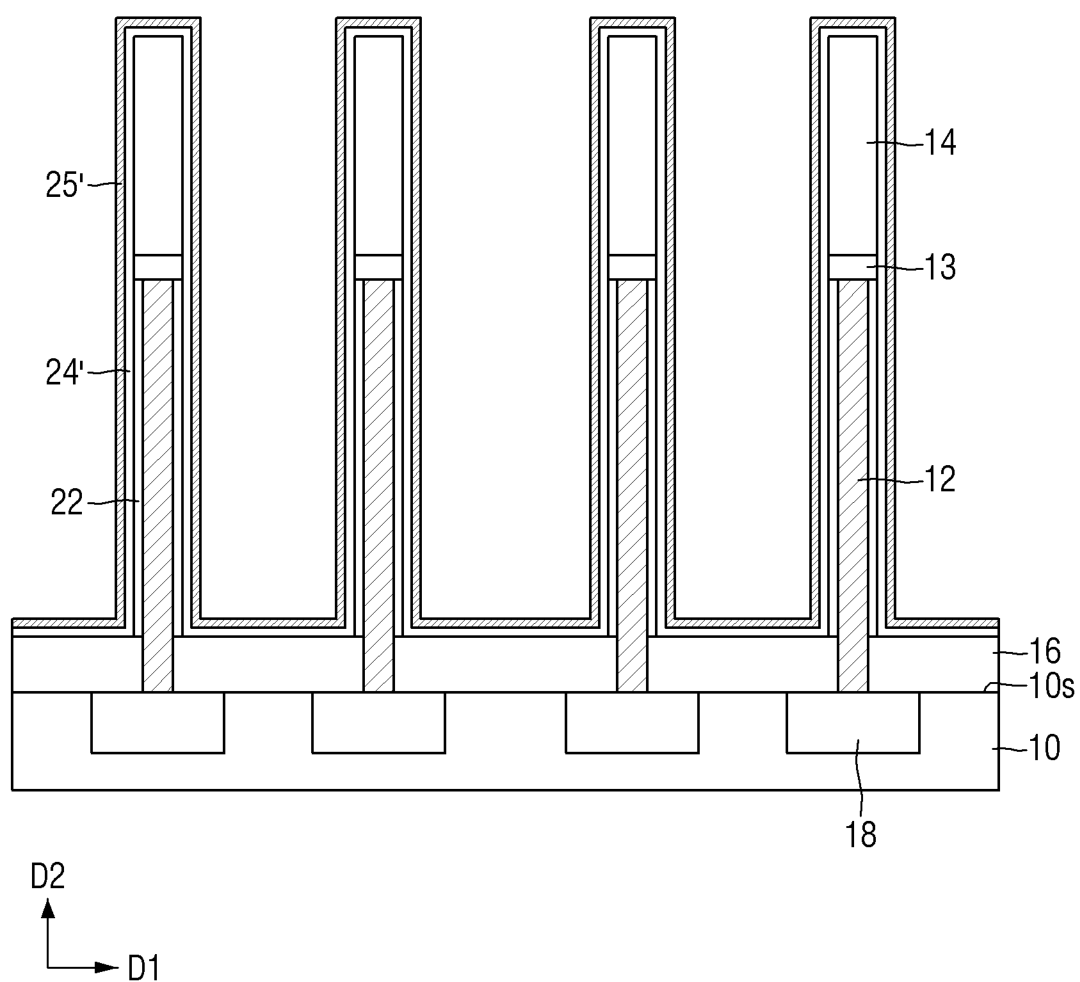
FIGS. 1 through 11B are views illustrating methods of forming a vertical field-effect transistor (VFET) device according to some embodiments of the present inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

FIGS. 1 through 11B are views illustrating methods of forming a VFET device according to some embodiments of the present inventive concept.

Referring to FIG. 1, the methods may include forming channel regions 12 on a substrate 10. The channel regions 12 may be spaced apart from each other in a first direction D1 (e.g., a horizontal direction). The first direction D1 may be parallel to an upper surface 10*s* of the substrate 10. Each of the channel regions 12 may protrude from the upper surface 10*s* of the substrate 10 in a second direction D2 (e.g., a vertical direction). The second direction D2 may be perpendicular to the upper surface 10*s* of the substrate 10.

In some embodiments, forming the channel regions 12 may include forming mask layers 14 on the substrate 10 and etching the substrate 10 using the mask layers 14 as an etch mask to form the channel regions 12. Accordingly, the channel regions 12 may be portions of the substrate 10. The substrate 10 may include one or more semiconductor materials, for example, Si, Ge, SiGe, GaP, GaAs, SiC, SiGeC and/or InP. In some embodiments, the substrate 10 may be a bulk substrate (e.g., a bulk silicon substrate) or a semiconductor on insulator (SOI) substrate.

In some embodiments, protecting layers 13 may be formed between the channel regions 12 and the mask layers 14. The protecting layers 13 may protect the channel regions 12 during subsequent processes (See e.g., FIGS. 4 and 5). In some embodiments, the protecting layers 13 may include a material that has an etch selectivity with respect to both the mask layers 14 and a sacrificial layer 26 (See e.g., FIG. 5).

The methods may also include forming bottom source/drains 18 in the substrate 10. In some embodiments, the bottom source/drains 18 may be formed by implanting impurities into the substrate 10 but the inventive concept is not limited thereto. In some embodiments, the bottom source/drains 18 may be formed by performing an epitaxial growth process using the substrate 10 as a seed layer, and impurities may be added during the epitaxial growth process. Although FIG. 1 shows multiple bottom source/drains 18 that are spaced apart from each other in the first direction D1, and each of the bottom source/drains 18 is overlapped by one of the channel regions 12, it will be understood that a single bottom source/drain 18 that is overlapped by multiple channel regions 12 can be formed according to some embodiments of the present inventive concept.

The methods may also include forming a bottom spacer 16 on the upper surface 10*s* of the substrate 10. The bottom spacer 16 may include an insulating material (e.g., silicon oxide, silicon nitride, and/or silicon oxinitride) that electrically insulates the substrate 10 from a gate structure that will be formed later.

Still referring to FIG. 1, an interfacial layer 22, a preliminary gate insulator layer 24', and a preliminary first work-function layer 25' may be formed on a side of the channel region 12. The side of the channel region 12 may extend in the second direction D2 as illustrated in FIG. 1. In some embodiments, the interfacial layer 22 may include, for example, an oxide layer (e.g., silicon oxide). For example, the interfacial layer 22 may be formed by oxidizing the channel region 12. In some embodiments, the interfacial layer 22 may be formed only on the side of the channel region 12 and may not be formed on a surface of the mask layer 14, as illustrated in FIG. 1.

The preliminary gate insulator layer 24' and the preliminary first work-function layer 25' may be sequentially formed on the interfacial layer 22 and the surface of the mask layer 14. The preliminary gate insulator layer 24' may include, for example, silicon oxide and/or a high-k material (e.g., hafnium oxide or aluminum oxide). The preliminary first work-function layer 25' may include, for example, metal nitride (e.g., TiN) and may provide oxygen to the preliminary gate insulator layer 24' during a subsequent annealing process (See e.g., FIG. 8) to cure oxygen vacancy of the preliminary gate insulator layer 24'. In some embodiments, each of the preliminary gate insulator layer 24' and the preliminary first work-function layer 25' may have a uniform thickness on the interfacial layer 22 and the mask layer 14, as illustrated in FIG. 1. It will be understood that a layer having a uniform thickness refers to a layer having a thickness variation less than 10%, 5%, or 1%.

Figure 2:
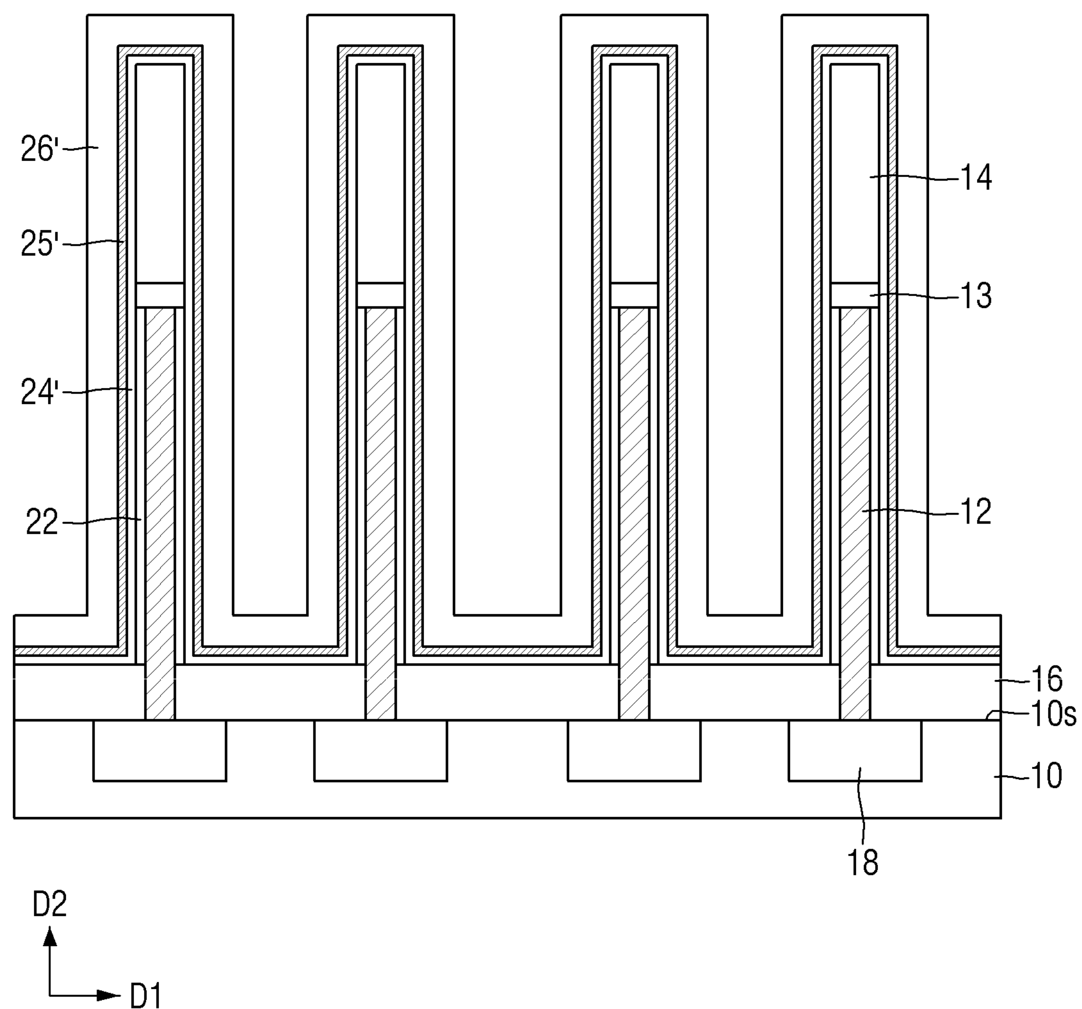

Referring to FIG. 2, a preliminary sacrificial layer 26' may be formed on the preliminary first work-function layer 25'. The preliminary sacrificial layer 26' may include, for example, a silicon layer (e.g., an amorphous silicon layer). In some embodiments, the preliminary sacrificial layer 26' may be formed to have a uniform thickness on a surface of an underlying structure as illustrated in FIG. 2. The preliminary sacrificial layer 26' may interfere with or block supply of excess oxygen to the preliminary gate insulator layer 24' during a subsequent annealing process (See e.g., FIG. 8).

Figure 3:
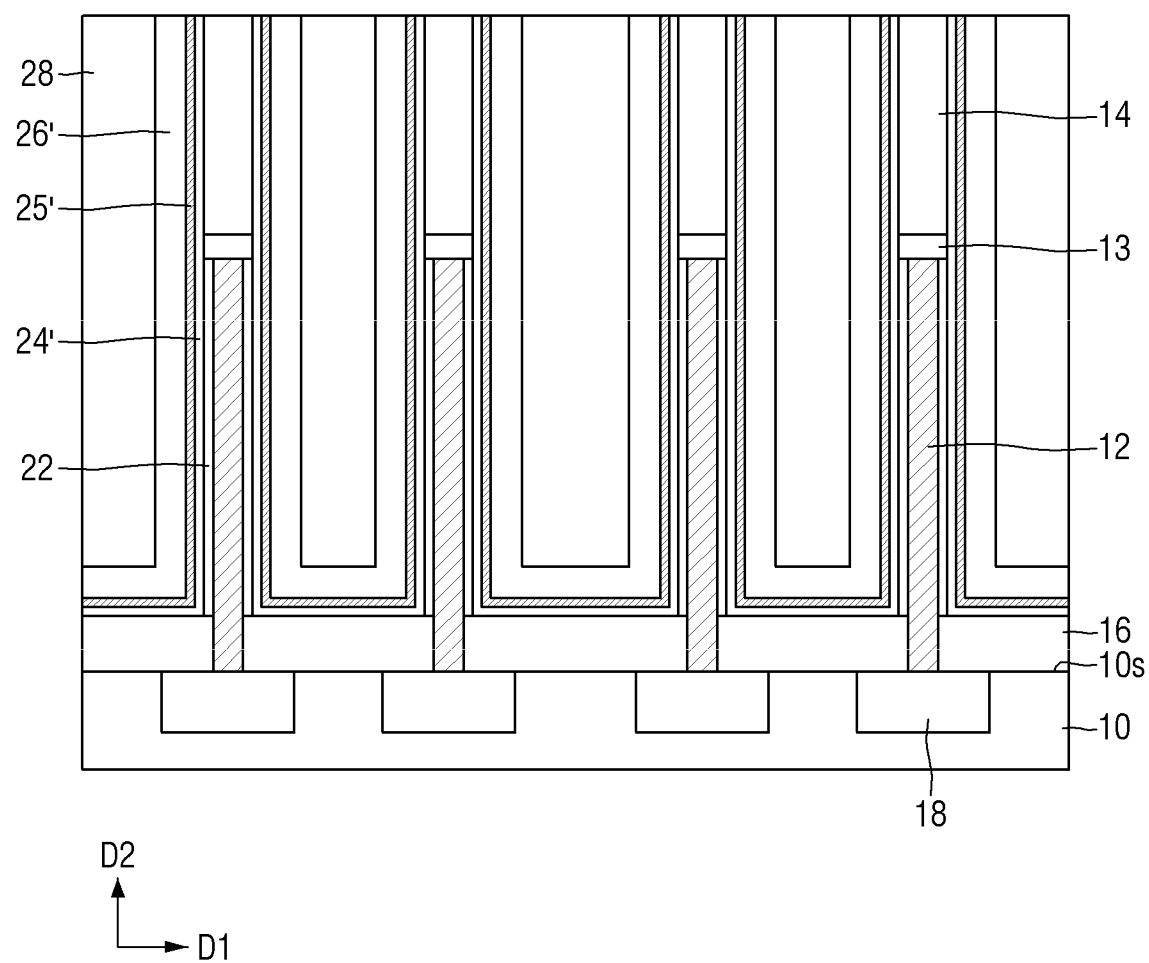

Referring to FIG. 3, a filling layer 28 may be formed. A preliminary filling layer may be formed on the structure shown in FIG. 2, and upper portions of the preliminary filling layer and the preliminary sacrificial layer 26' may be removed by, for example, an etching process and/or a chemical mechanical planarization (CMP) process, to form the filling layer 28. In some embodiments, the preliminary filling layer and the preliminary sacrificial layer 26' may be removed until an upper surface of the mask layer 14 is exposed, as illustrated in FIG. 3. For example, the filling layer 28 may include an insulating material (e.g., silicon oxide).

Figure 4:
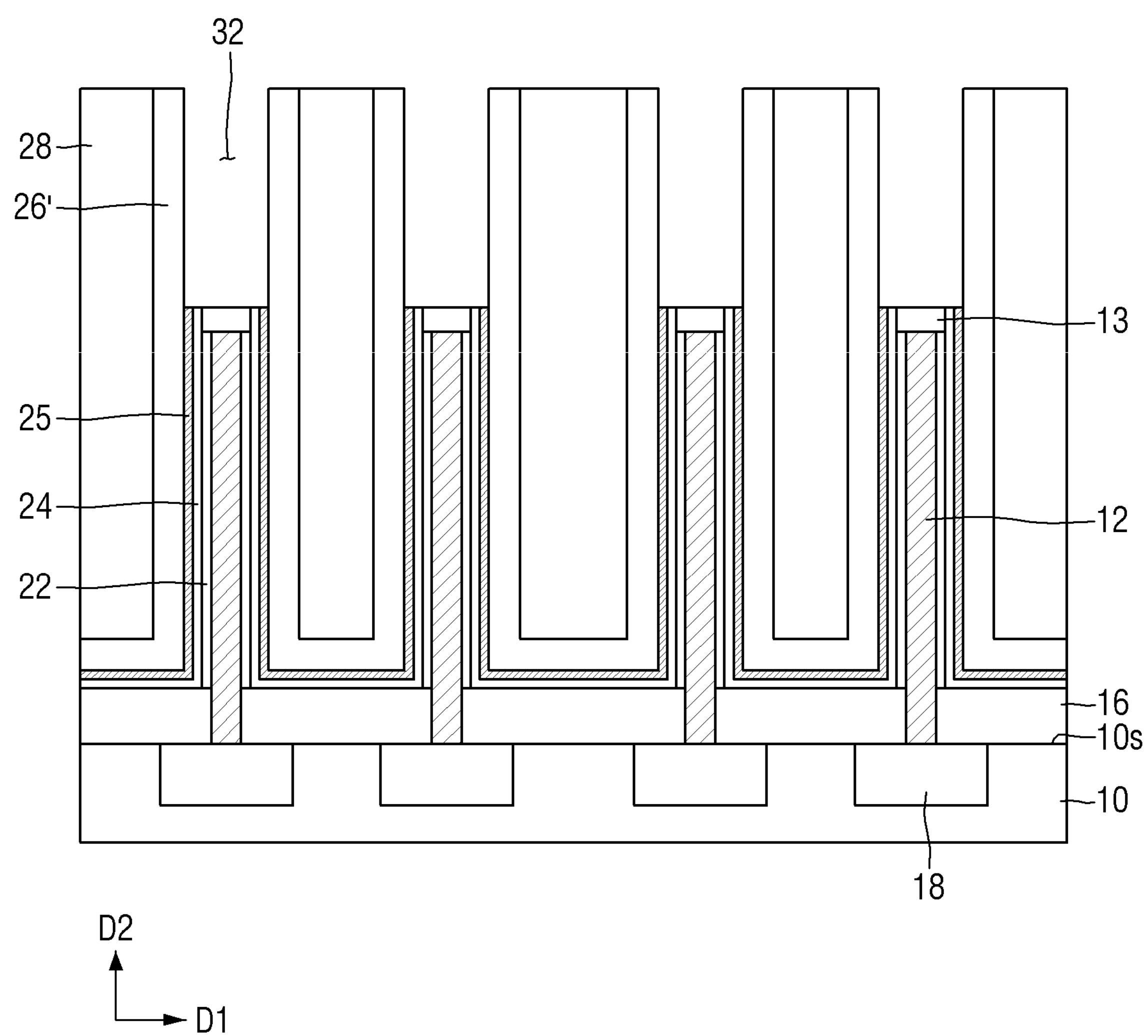

Referring to FIG. 4, the mask layer 14, an upper portion of the preliminary gate insulator layer 24', and an upper portion of the preliminary first work-function layer 25' may be removed such that a recess 32 may be formed in the filling layer 28, and a gate insulator layer 24 and a first work-function layer 25 may also be formed. Removing the mask layer 14, the upper portion of the preliminary gate insulator layer 24', and the upper portion of the preliminary first work-function layer 25' may be performed using various processes (e.g., a dry etching process or a wet etching process).

Removing the mask layer 14 may be performed until the protecting layer 13 is exposed, and thus an upper surface of the channel region 12 may not be exposed while removing the mask layer 14. In some embodiments, the mask layer 14, the upper portion of the preliminary gate insulator layer 24', and the upper portion of the preliminary first work-function layer 25' may be removed selectively with respect to the preliminary sacrificial layer 26' such that a side of the recess 32 may be defined by the preliminary sacrificial layer 26'.

Figure 5:
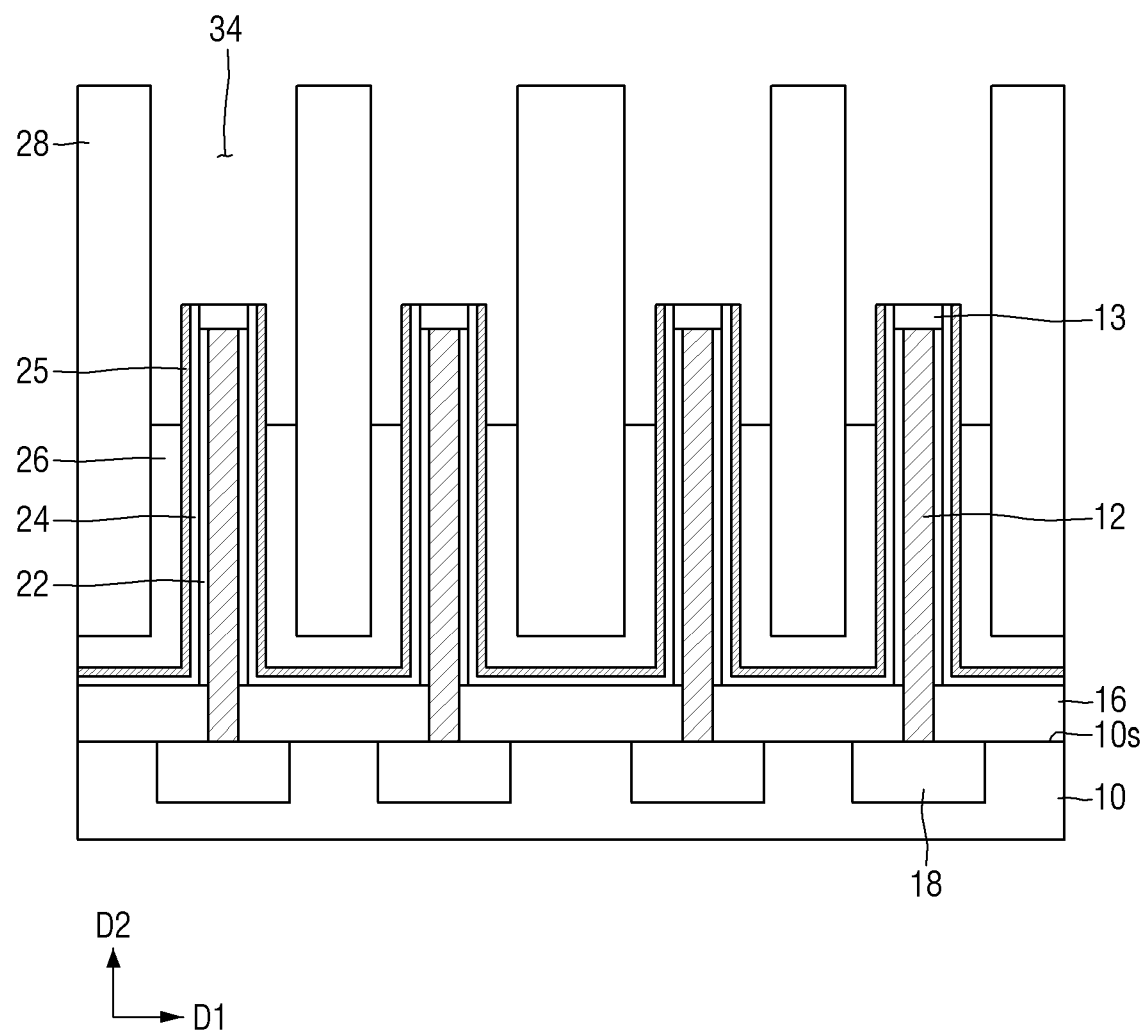

Referring to FIG. 5, an upper portion of the preliminary sacrificial layer 26' may be removed such that a sacrificial layer 26 and an enlarged recess 34 may be formed on the channel region 12. The upper portion of the preliminary sacrificial layer 26' may be removed by various methods (e.g., a dry etching process or a wet etching process). In some embodiments, the upper portion of the preliminary sacrificial layer 26' may be removed until an upper surface of the sacrificial layer 26 is located at a level lower than an upper surface of the channel region 12, as illustrated in FIG. 5. In some embodiments, the gate insulator layer 24 and the first work-function layer 25 may have upper portions above the upper surface of the sacrificial layer 26, as illustrated in FIG. 5. In some embodiments, as illustrated in FIG. 5, a side of the enlarged recess 34 may be defined by the filling layer 28.

In some embodiments, as illustrated in FIG. 5, during removal of the upper portion of the preliminary sacrificial layer 26', the protecting layer 13 is on the channel region 12. Accordingly, the channel region 12 is not exposed and thus may not be damaged and/or etched during removal of the upper portion of the preliminary sacrificial layer 26'. After the sacrificial layer 26 is formed, the protecting layer 13 may be removed to expose the channel region 12.

Figure 6:
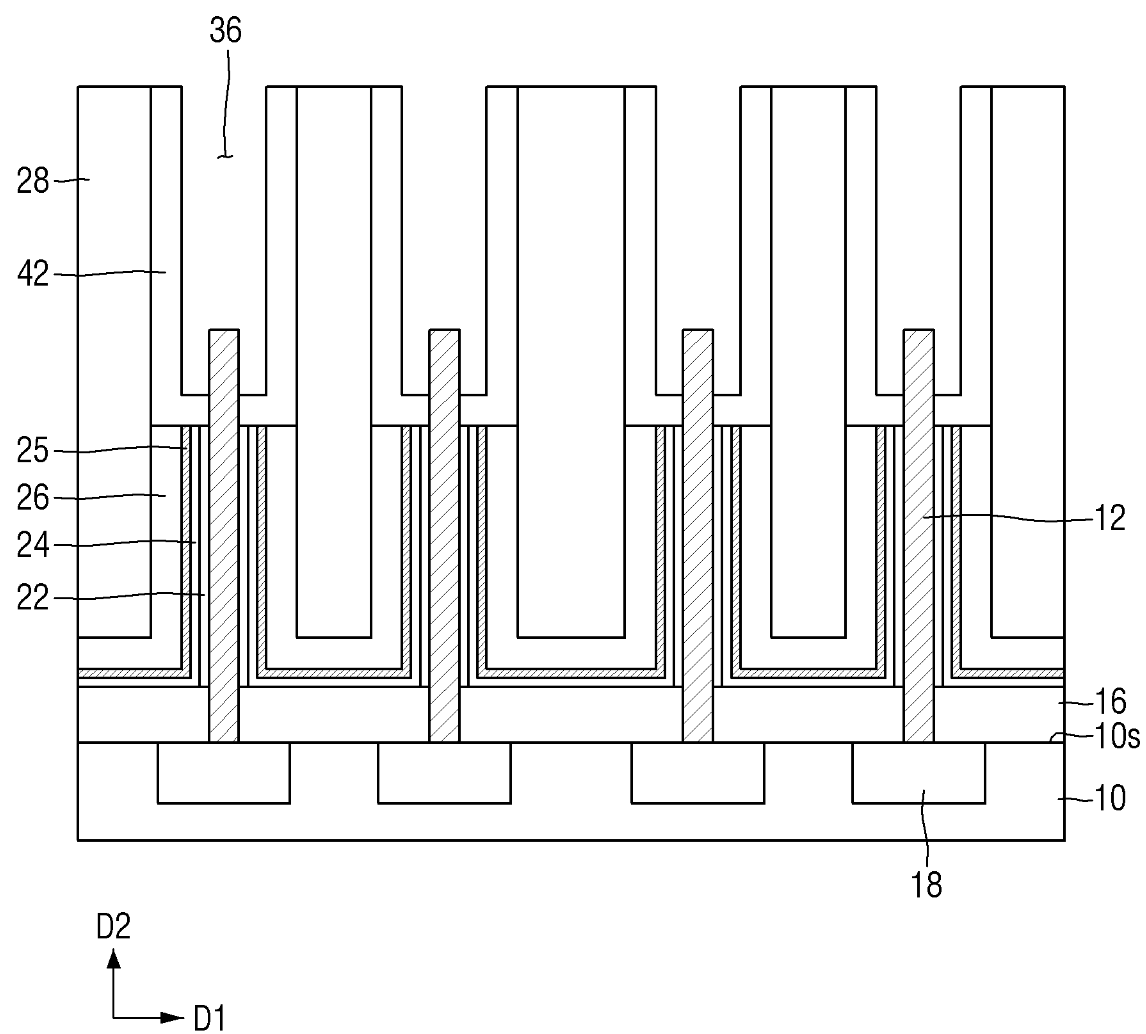

Referring to FIG. 6, upper portions the interfacial layer 22, the upper portions of the gate insulator layer 24 and the first work-function layer 25 above the upper surface of the sacrificial layer 26 may be removed to expose the channel region 12 and then a top spacer 42 may be formed on a surface of the enlarged recess 34. In some embodiments, the top spacer 42 may be formed to extend along the surface of the enlarged recess 34 and may have a uniform thickness on the surface of the enlarged recess 34, as illustrated in FIG. 6. In some embodiments, the top spacer 42 may have a uniform thickness on the filling layer 28 as illustrated in FIG. 6 and may define a top recess 36. The top spacer 42 may include an insulating material (e.g., silicon oxide, silicon nitride and/or silicon oxinitride). The top recess 36 may expose the upper portion of the channel region 12, as illustrated in FIG. 6.

Figure 7:
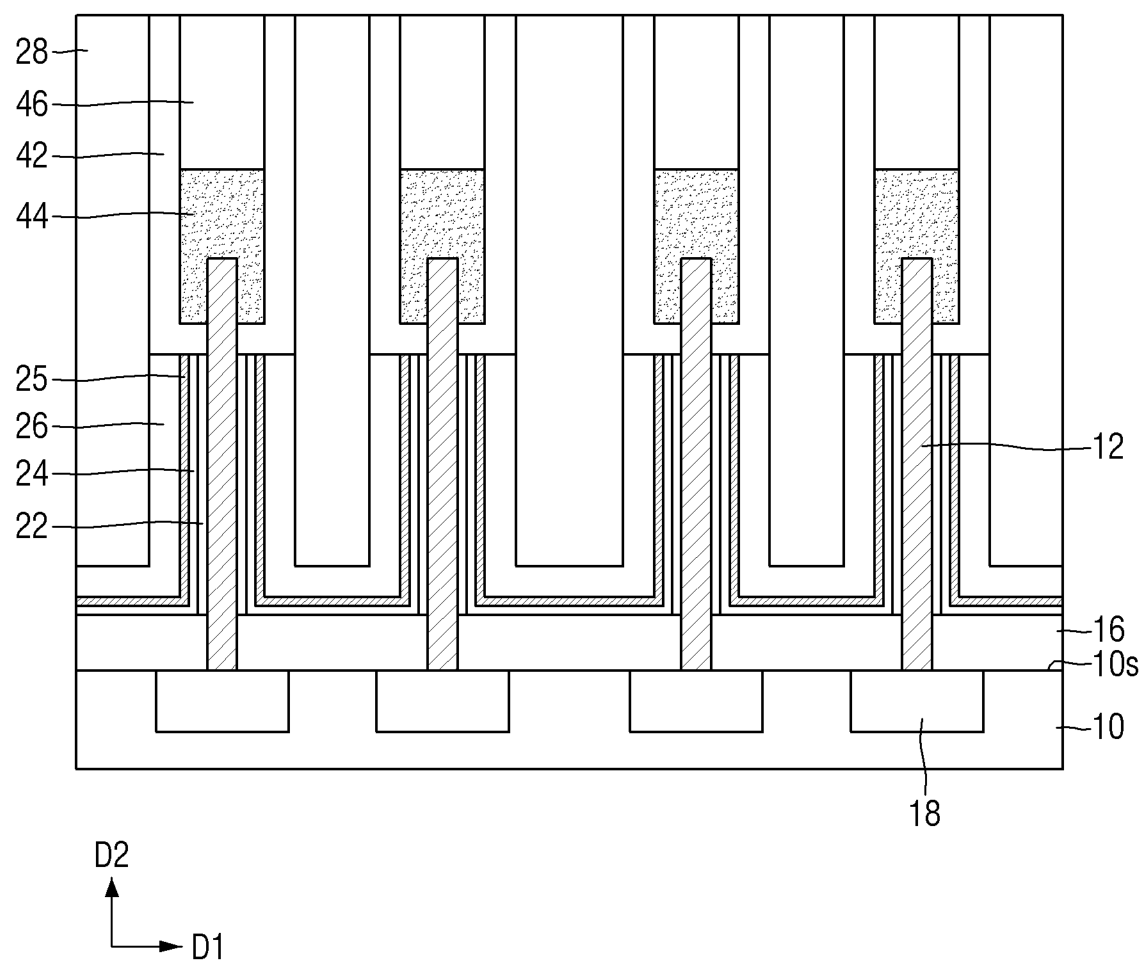

Referring to FIG. 7, a top source/drain 44 may be formed on the channel region 12. In some embodiments, the top source/drain 44 may be formed by an epitaxial growth process using the channel region 12 as a seed layer. An epitaxial growth process for forming the top source/drain 44 may be performed at a high temperature (e.g., a temperature in a range of about 400° C. to about 700° C.) As illustrated in FIG. 7, the top source/drain 44 may be formed in the top recess 36 of FIG. 6. In some embodiments, a capping layer 46 may be formed on the top source/drain 44 in the top recess 36. The capping layer 46 may include insulating material (e.g., silicon oxide, silicon nitride and/or silicon oxinitride).

Figure 9:
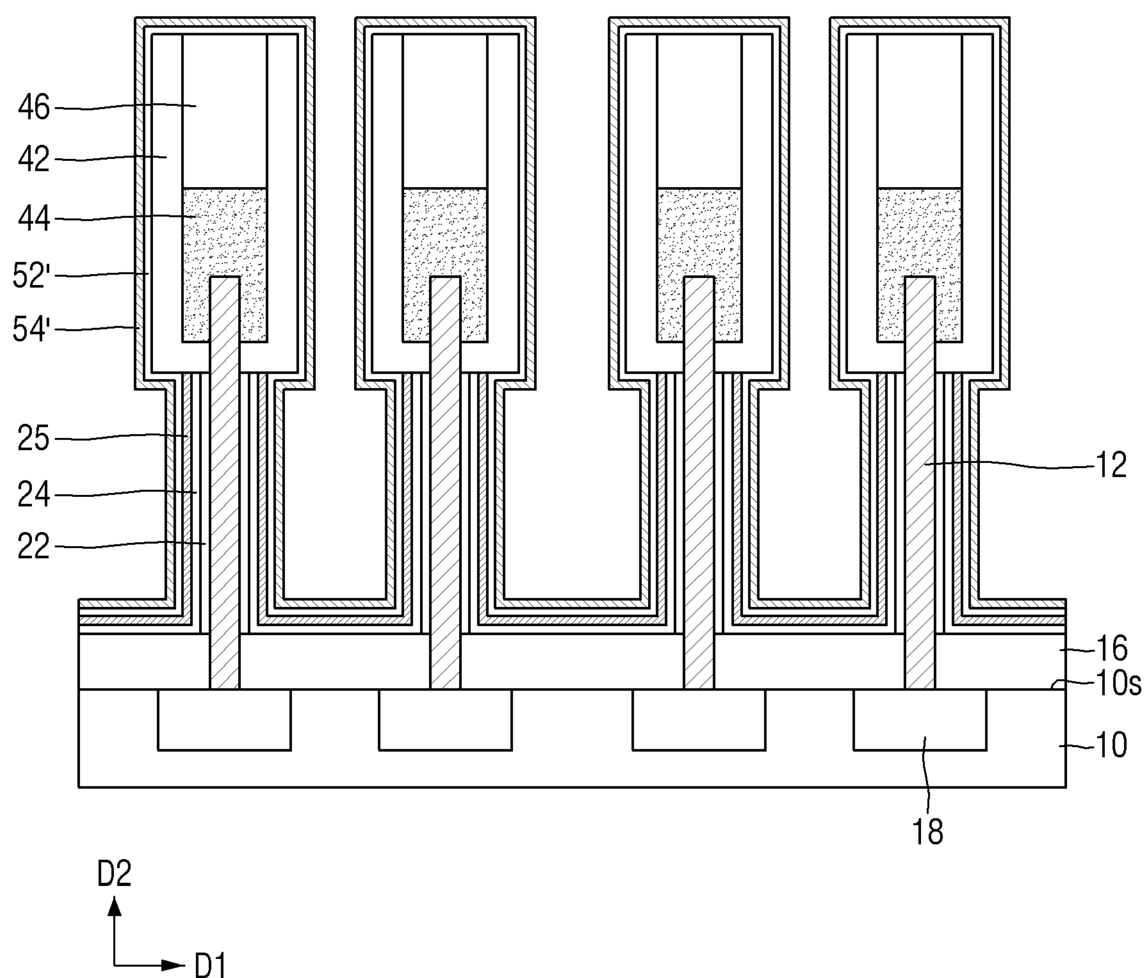

In some embodiments, the top source/drain 44 may be formed before forming a material included in a gate electrode (e.g., a preliminary second work-function layer 52' and a preliminary gate layer 54' in FIG. 9). Therefore, properties of the material included in a gate electrode may not be changed by processes of forming the top source/drain 44.

Figure 8:
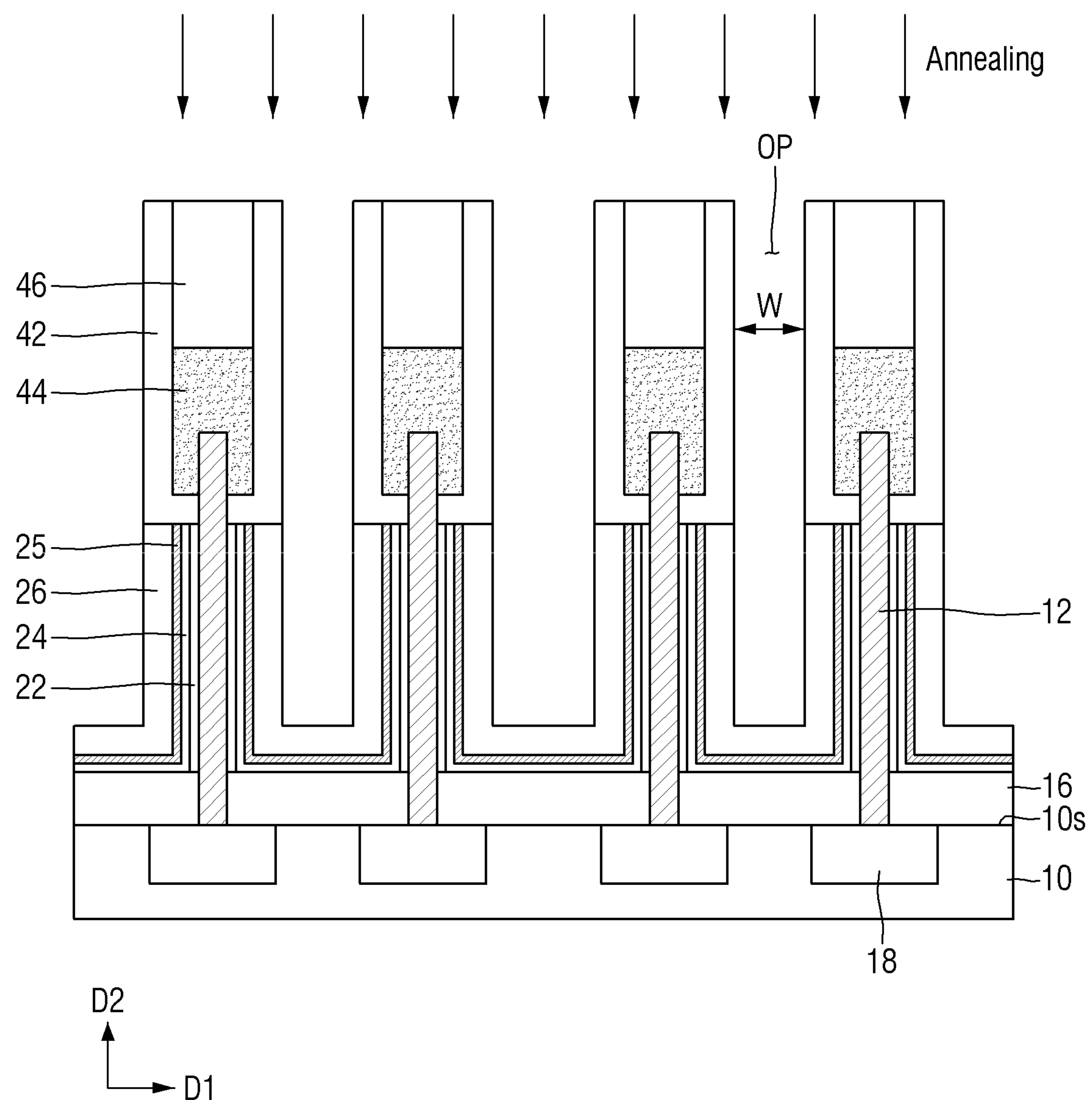

Referring to FIG. 8, in some embodiments, the filling layer 28 may be removed and an annealing process may be performed. For example, the annealing process may be performed using a gas (e.g., $N_2$) at a temperature in a range of about 900° C. to about 1000° C. for about 5 seconds to about 15 seconds. The annealing process may reduce or possibly remove defects (e.g., defects in the interfacial layer 22, the gate insulator layer 24 and the first work-function layer 25 generated during removal of the mask layer 14 and/or removal of the upper portion of the preliminary sacrificial layer 26') by heating the structure shown in FIG. 8. In some embodiments, the annealing process may cure oxygen vacancy in the gate insulator layer 24 by supplying oxygen from the first work-function layer 25 into the gate insulator layer 24. The annealing process may improve reliability of the device.

In some embodiments, the annealing process may be performed before forming a material included in a gate electrode (e.g., a preliminary second work-function layer 52' and/or a preliminary gate layer 54' in FIG. 9). Therefore, properties of the material included in a gate electrode may not be changed by the annealing process.

Referring to FIG. 9, the sacrificial layer 26 may be removed and then a preliminary second work-function layer 52' and a preliminary gate layer 54' may be sequentially formed on the first work-function layer 25. In some embodiments, each of the preliminary second work-function layer 52' and the preliminary gate layer 54' may be formed to have a uniform thickness. The preliminary second work-function layer 52' may include, for example, metal nitride (e.g., TiN, TiAl, TiAlN, TaC, TaAlN, TiC, or HfSi), and the preliminary gate layer 54' may include metal (e.g., W, Al and/or Cu).

It will be understand that a number of and thicknesses of layers (e.g., the preliminary second work-function layer 52' and the preliminary gate layer 54') formed on the first work-function layer 25 after removing the sacrificial layer 26 may be limited by a width W of an opening OP between two adjacent top spacers 42, which is shown in FIG. 8, because those layers should not block the opening OP. Therefore, maintaining the width W of the opening OP wider than a predetermined width may be beneficial. It will be also understood that if the preliminary gate insulator layer 24' and the preliminary first work-function layer 25' are formed after forming the structure shown in FIG. 8, a number of and thicknesses of layers formed on the first work-function layer 25 may be further limited as the preliminary gate insulator layer 24' and the preliminary first work-function layer 25' may be formed on sides of the top spacers 42. Accordingly, forming the preliminary gate insulator layer 24' and a preliminary first work-function layer 25' before forming the top spacer 42 may be beneficial to maintain the width W of the opening OP sufficiently large.

Figure 10:
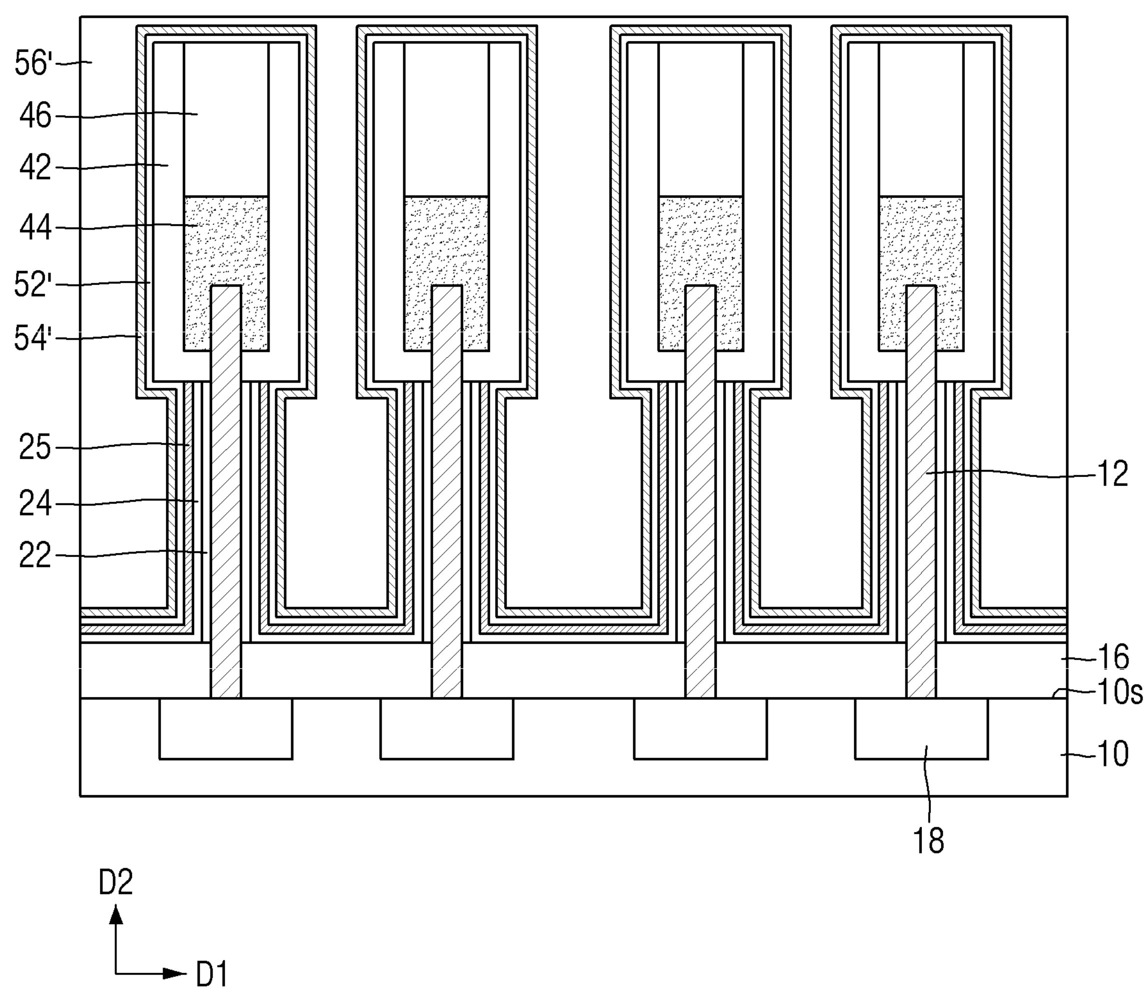

Referring to FIG. 10, a preliminary mask layer 56' may be formed on the structure shown in FIG. 9. The preliminary mask layer 56' may include a hard mask material but the inventive concept is not limited thereto. Various materials can be used as the preliminary mask layer 56'.

Figure 11A:
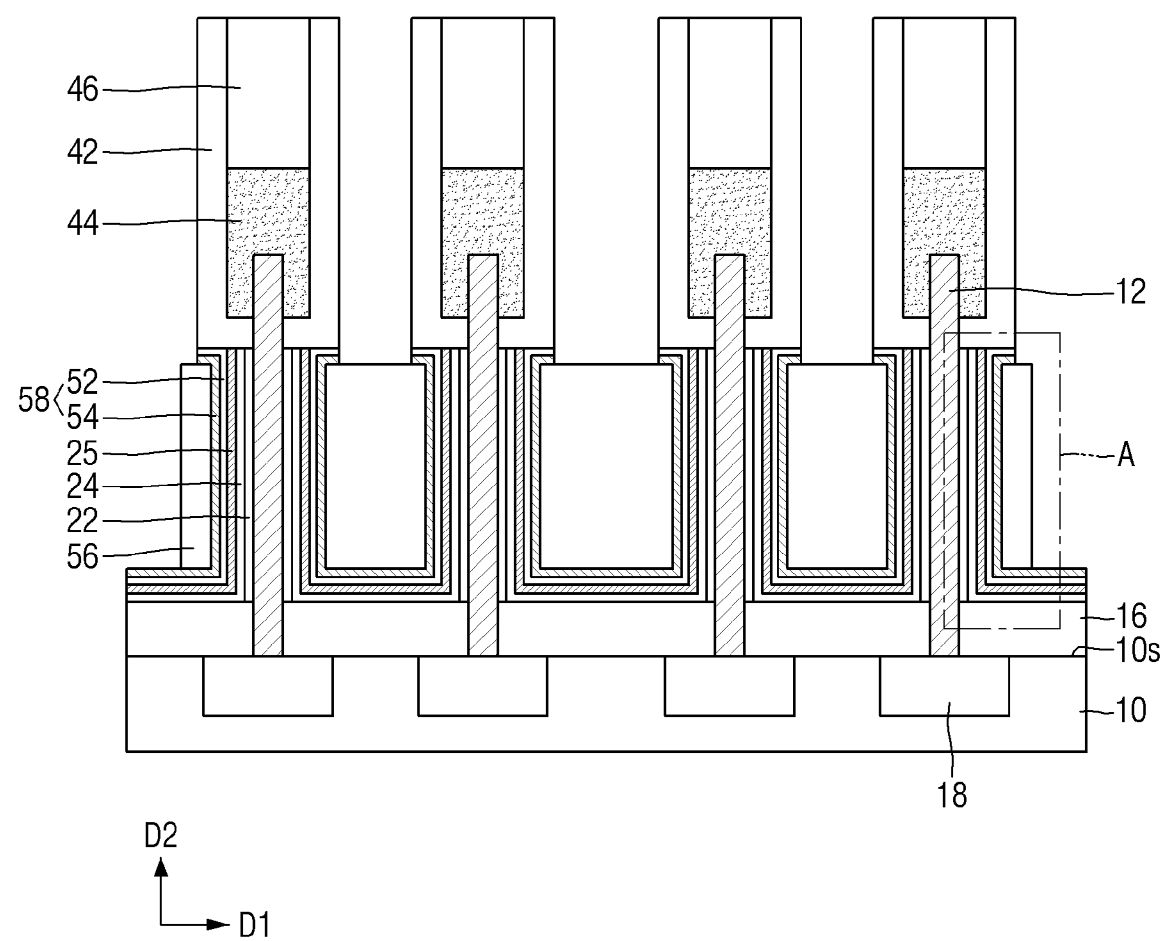
Figure 11B:
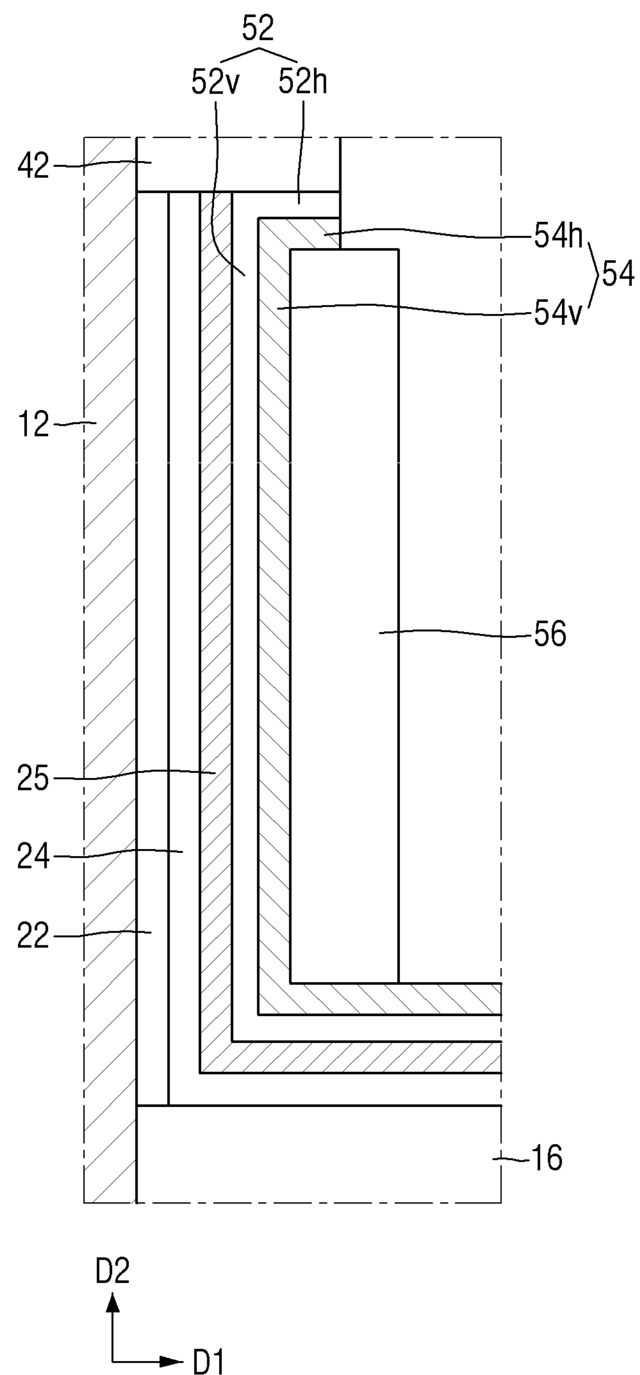

Referring to FIG. 11A, an etching process (e.g., a dry etching process or a wet etching process) may be performed on the structure shown in FIG. 10 using the top spacer 42 and the capping layer 46 as an etch mask such that portions of the preliminary second work-function layer 52' and portions of the preliminary gate layer 54' that are formed on an outer side surface of the top spacer 42 and on an upper surface of the capping layer 46 may be removed. Therefore, a gate electrode 58 including a second work-function layer 52 and a gate layer 54 may be formed on the gate insulator layer 24 as illustrated in FIG. 11B. In some embodiments, a portion of the preliminary mask layer 56' may remain under the top spacer 42 and the capping layer 46.

FIG. 11B is an enlarged view of the region A of FIG. 11A. Referring to FIG. 11B, in some embodiments, each of the gate insulator layer 24 and the first work-function layer 25 may have an upper portion that is adjacent the top spacer 42, and the upper portion of each of the gate insulator layer 24 and the first work-function layer 25 may have a straight line shape. In other words, in some embodiments, the upper portion of each of the gate insulator layer 24 and the first work-function layer 25 may include only a vertical portion extending in the vertical direction D2 and may not include a horizontal portion protruding from an upper end of its vertical portion in a horizontal direction (e.g., first direction D1), as illustrated in FIG. 11B.

Referring to FIG. 11B, in some embodiments, the second work-function layer 52 may include a horizontal portion **52*h* that protrudes from an upper end of a vertical portion 52*v* of the second work-function layer 52. In some embodiments, the horizontal portion 52*h* of the second work-function layer 52 may directly contact a lower surface of the top spacer 42. In some embodiments, the vertical portion 52*v* of the second work-function layer 52 may directly contact the first work-function layer 25. The gate layer 54 may also include a horizontal portion 54*h* that protrudes from an upper end of a vertical portion 54*v*** thereof.

Although FIGS. 9 through 11B show that a gate electrode 58 includes only two layers, the second work-function layer 52 and the gate layer 54, it will be understood that a gate electrode can include three or more layers.

After the structure shown in FIG. 11A is formed, various processes may be performed to complete formation of a VFET device. For example, the mask layer 56 may be removed and an insulating layer may be formed to fill a space between two adjacent channel regions 12. Further, a portion of the capping layer 46 and/or a portion of the top spacer 42 may be removed such that a conductive layer that will be formed may be electrically connected to the top source/drain 44.

According to the methods of forming a VFET device discussed herein, layers included in a gate electrode (e.g., the second work-function layer 52 and the gate layer 54) may be formed after a top source/drain 44 is formed. Therefore, properties of the layers included in the gate electrode will not be changed by processes of forming the top source/drain 44. Specifically, thermal stress induced by the processes of forming the top source/drain 44 may not change the properties of the layers included in the gate electrode.

According to the methods of forming a VFET device discussed herein, the gate insulator layer 24 and the first work-function layer 25 may be formed before forming the top spacer 42, and thus the gate insulator layer 24 and the first work-function layer 25 may not reduce a size of the opening OP between two adjacent top spacers 42 (See FIG. 8). Therefore, forming the preliminary second work-function layer 52' and the preliminary gate layer 54' may be performed without blocking the opening OP. Further, it may be possible to form an additional layer included in the gate electrode 58 without blocking the opening OP.

Figure 12:
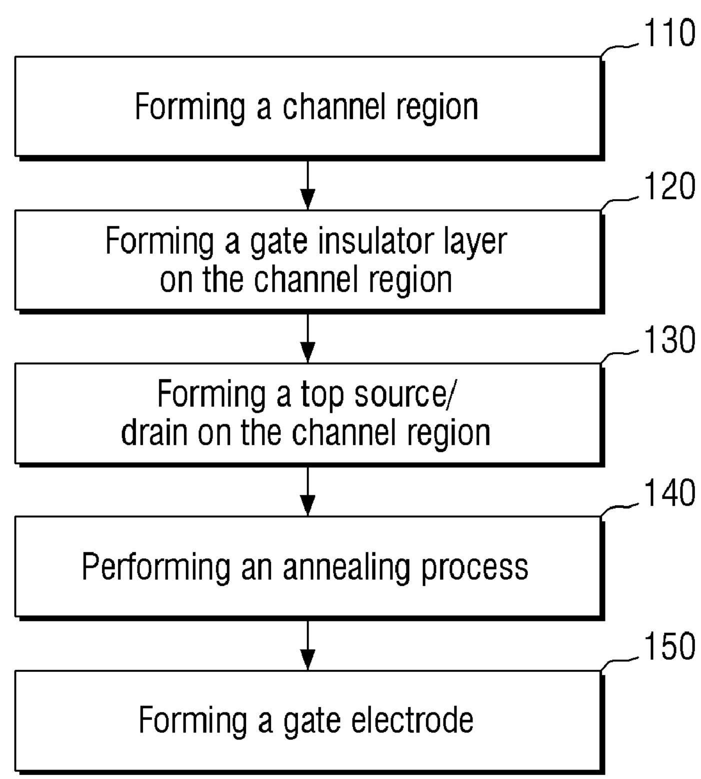
FIG. 12 is a flowchart illustrating methods of forming a VFET device according to some embodiments of the inventive concept.

Referring to FIG. 12, the methods according to some embodiments of the inventive concept may include: forming a channel region 12 on a substrate 10 (Block 110) (See e.g., FIG. 1); forming a gate insulator layer 24 on the channel region 12 (Block 120) (See e.g., FIGS. 2 through 4); forming a top source/drain 44 on the channel region 12 (Block 130) (See e.g., FIGS. 5 through 7); performing an annealing process (Block 140) (See e.g., FIG. 8); and forming a gate electrode 58 (Block 150) (See e.g., FIGS. 9 through 11B).

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof.

It will be understood that references herein to "an element A vertically overlapping an element B" (or similar language) means that a vertical line intersecting both the elements A and B exists.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming a vertical field-effect transistor (VFET) device, the method comprising:

forming a channel structure comprising a channel region and a mask layer sequentially stacked on a substrate, wherein the channel region protrudes from an upper surface of the substrate in a vertical direction;

forming a gate insulator layer on a side of the channel region, wherein forming the gate insulator layer comprises:

sequentially forming a preliminary gate insulator layer and a preliminary sacrificial layer on the side of the channel region and on a side of the mask layer;

forming a filling layer on the preliminary sacrificial layer; and removing the mask layer and an upper portion of the preliminary gate insulator layer to form the gate insulator layer on the side of the channel region and to form a recess in the filling layer;

after forming the gate insulator layer, forming a top source/drain on the channel region; and forming a gate electrode on the gate insulator layer.

2. The method of claim 1, further comprising forming a first work-function layer on the gate insulator layer before forming the top source/drain.

3. The method of claim 1, wherein forming the channel structure comprises:

forming the mask layer on the substrate; and etching the substrate using the mask layer as an etch mask to form the channel region.

4. The method of claim 1, wherein each of the preliminary gate insulator layer and the preliminary sacrificial layer has a uniform thickness on the side of the channel region and on the side of the mask layer before forming the filling layer on the preliminary sacrificial layer.

5. The method of claim 1, wherein the preliminary sacrificial layer comprises amorphous silicon.

6. The method of claim 1, further comprising removing an upper portion of the preliminary sacrificial layer to form a sacrificial layer and to form an enlarged recess in the filling layer by enlarging the recess.

7. The method of claim 6, further comprising:

forming the top source/drain in the enlarged recess;

removing the filling layer to expose the sacrificial layer; and performing an annealing process.

8. The method of claim 7, further comprising, after performing the annealing process, replacing the sacrificial layer with the gate electrode.

9. The method of claim 6, further comprising forming a top spacer layer along a surface of the enlarged recess, wherein the top spacer layer defines a top recess in the enlarged recess, and wherein the top source/drain is formed in the top recess.

10. The method of claim 9, wherein the gate electrode comprises a second work-function layer and a gate layer sequentially stacked on the gate insulator layer, and wherein the second work-function layer comprises a vertical portion extending on the gate insulator layer and a horizontal portion that protrudes from an upper end of the vertical portion of the second work-function layer.

11. The method of claim 1, further comprising forming an interfacial layer on the channel region before forming the gate insulator layer.

12. The method of claim 1, further comprising:

before forming the top source/drain, forming a top spacer on the gate insulator layer, wherein the top spacer defines a top recess in the recess and the top source/drain is formed in the top recess of the filling layer.

13. The method of claim 12, further comprising performing an annealing process after the top source/drain is formed and before forming the gate electrode.

14. The method of claim 1, wherein forming the gate electrode comprises forming a plurality of layers that are sequentially stacked on the gate insulator layer and comprise a first layer, and the first layer of the gate electrode comprises a vertical portion and a horizontal portion protruding from an upper end of the vertical portion of the first layer.

15. The method of claim 14, further comprising forming a top spacer on the channel region before forming the top source/drain, wherein the top spacer defines a top recess therein, and the top source/drain is formed in the top recess, and wherein the horizontal portion of the first layer of the gate electrode directly contacts a lower surface of the top spacer.

16. The method of claim 14, wherein the first layer of the gate electrode comprises a work-function layer.

17. The method of claim 1, wherein the top source/drain is formed before forming the gate electrode.

18. The method of claim 12, further comprising forming a capping layer in the top recess on the top source/drain, wherein forming the gate electrode comprises:

forming a preliminary gate layer extending on the side of the channel region and a lower surface, a side, and an upper surface of the top spacer; and removing a portion of the preliminary gate layer extending on the side and the upper surface of the top spacer by performing an etch process.

19. The method of claim 18, wherein forming the gate electrode further comprises forming a gate mask layer on the preliminary gate layer before performing the etch process, and the gate mask layer comprises a lower portion on the side of the channel region and an upper portion on the lower portion of the gate mask layer, and wherein performing the etch process comprises removing the upper portion of the gate mask layer.

20. The method of claim 18, wherein the preliminary gate layer has a uniform thickness on the lower surface, the side, and the upper surface of the top spacer.

* * * * *